United States Patent
Lee et al.

(10) Patent No.: US 10,999,957 B2
(45) Date of Patent: May 4, 2021

(54) COMMUNICATION MODULE AND MOUNTING STRUCTURE THEREOF

(71) Applicant: Samsung Electro-Mechanics Co., Ltd., Suwon-si (KR)

(72) Inventors: Gye Won Lee, Suwon-si (KR); Nam Gyun Yim, Suwon-si (KR); Eun Bae Park, Suwon-si (KR); Hong Seok Lee, Suwon-si (KR); Jong Yun Kim, Suwon-si (KR); Woo Sung Jung, Suwon-si (KR); Mi Jung Kim, Suwon-si (KR); Chang Ju Lee, Suwon-si (KR); Hee Sun Oh, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 374 days.

(21) Appl. No.: 16/188,709

(22) Filed: Nov. 13, 2018

(65) Prior Publication Data

US 2019/0252756 A1    Aug. 15, 2019

(30) Foreign Application Priority Data

Feb. 12, 2018 (KR) .................. 10-2018-0017070
Jun. 15, 2018 (KR) .................. 10-2018-0069209

(51) Int. Cl.
*H05K 9/00* (2006.01)
*H05K 7/20* (2006.01)
(Continued)

(52) U.S. Cl.
CPC .......... *H05K 9/0033* (2013.01); *H01L 23/10* (2013.01); *H01L 23/367* (2013.01);
(Continued)

(58) Field of Classification Search
CPC .. H05K 1/0203; H05K 1/021; H05K 7/20509; H05K 7/20472; H05K 9/0024;
(Continued)

(56) References Cited

U.S. PATENT DOCUMENTS 6,239,359 B1 *   5/2001   Lilienthal, II ....... H05K 9/0028
                                                                  174/370
8,929,078 B2 *   1/2015   Weeber .............. H05K 7/20418
                                                                  361/714
(Continued)

FOREIGN PATENT DOCUMENTS

CN    101431068 A    5/2009
CN    102548365 A    7/2012
(Continued)

OTHER PUBLICATIONS

European Office Action the Examination Report dated Dec. 23, 2020 issued in counterpart European patent application No. 18208851.8. (9 pages in English).

(Continued)

*Primary Examiner* — Zachary Pape
(74) *Attorney, Agent, or Firm* — NSIP Law

(57) ABSTRACT

A module substrate includes a module substrate including a plurality of external connection electrodes disposed on a second surface thereof; communication elements mounted on the module substrate, the communication elements including one or more first communication elements mounted on a first surface of the module substrate and one or more second communication elements mounted on the second surface of the module substrate; a first heat radiation frame mounted on the first surface of the module substrate and configured to accommodate at least one of the one or more first communication elements; and a second heat radiation frame mounted on the second surface of the module substrate and configured to accommodate at least (Continued)

one of the one or more second communication elements. One or more of the external connection electrodes are disposed around the second heat radiation frame.

15 Claims, 12 Drawing Sheets

(51) Int. Cl.
| | |
|---|---|
| *H05K 1/02* | (2006.01) |
| *H01L 23/367* | (2006.01) |
| *H01L 23/10* | (2006.01) |
| *H05K 1/14* | (2006.01) |
| *H01L 23/552* | (2006.01) |
| *H01L 25/16* | (2006.01) |
| *H01L 25/18* | (2006.01) |
| *H01L 23/373* | (2006.01) |
| *H01L 23/42* | (2006.01) |
| *H01L 23/00* | (2006.01) |

(52) U.S. Cl.
CPC ............ *H01L 23/552* (2013.01); *H01L 25/16* (2013.01); *H01L 25/18* (2013.01); *H05K 1/021* (2013.01); *H05K 1/0203* (2013.01); *H05K 1/141* (2013.01); *H05K 7/20472* (2013.01); *H05K 7/20509* (2013.01); *H01L 23/3736* (2013.01); *H01L 23/3737* (2013.01); *H01L 23/42* (2013.01); *H01L 24/29* (2013.01); *H05K 1/0216* (2013.01); *H05K 2201/10371* (2013.01)

(58) Field of Classification Search
CPC ................ H05K 9/0033; H05K 9/0032; H01L 23/34–4735; H01L 23/10
See application file for complete search history.

(56) References Cited

U.S. PATENT DOCUMENTS

| | | | |
|---|---|---|---|
| 10,251,257 B2 * | 4/2019 | Lai | ........................ H05K 1/0203 |
| 2001/0004313 A1 | 6/2001 | Yamaoka | |
| 2009/0000114 A1 | 1/2009 | Rao et al. | |
| 2009/0040731 A1 | 2/2009 | Jin et al. | |
| 2009/0121326 A1 | 5/2009 | Kim et al. | |
| 2009/0168386 A1 * | 7/2009 | Suzuki | ................... H05K 9/003 |
| | | | 361/810 |
| 2010/0091464 A1 | 4/2010 | Ohnishi et al. | |
| 2013/0127025 A1 | 5/2013 | Cho | |
| 2013/0213704 A1 | 8/2013 | Lu et al. | |
| 2014/0217610 A1 | 8/2014 | Jeng et al. | |
| 2014/0347819 A1 | 11/2014 | Ott | |
| 2015/0282387 A1 | 10/2015 | Yoo et al. | |
| 2015/0325529 A1 * | 11/2015 | Choi | ..................... H01L 25/105 |
| | | | 257/723 |
| 2016/0120039 A1 * | 4/2016 | Bang | ...................... H05K 3/341 |
| | | | 29/832 |

FOREIGN PATENT DOCUMENTS

| | | |
|---|---|---|
| CN | 107546197 A | 1/2018 |
| DE | 10 2007 006 462 A1 | 8/2008 |
| JP | 4941555 B2 | 5/2012 |
| JP | 2018-014393 A | 1/2018 |
| KR | 10-1222787 B1 | 1/2013 |
| KR | 10-2013-0056570 A | 5/2013 |

OTHER PUBLICATIONS

Chinese Office Action dated Feb. 25, 2020 in corresponding Chinese Patent Application No. 201910104606.2 (17 pages in English, 12 pages in Chinese).

European Office Action dated Mar. 25, 2019 in corresponding European Patent Application No. 18208851.8 (11 pages in English).

* cited by examiner

COMMUNICATION MODULE AND MOUNTING STRUCTURE THEREOF

CROSS-REFERENCE TO RELATED APPLICATIONS

This application claims the benefit under 35 USC 119(a) of Korean Patent Application Nos. 10-2018-0017070 filed on Feb. 12, 2018 and 10-2018-0069209 filed on Jun. 15, 2018 in the Korean Intellectual Property Office, the entire disclosures of which are incorporated herein by reference for all purposes.

BACKGROUND

1. Field

This following description relates to a communication module and a mounting structure thereof.

2. Description of the Background

Recently, various kinds of communication modules have been mounted in vehicles.

FIG. 1 is a cross-sectional view schematically illustrating an electrical communication module of the related art.

Referring to FIG. 1, the electrical communication module of the related art includes various communication devices, such as an NAD (Network Access Device) module 1, a Wi-Fi module 2, and a BT (Bluetooth®) module 3 arranged on a unit substrate 9 and is electrically connected externally through the unit substrate 9.

Each of the communication devices 1, 2 and 3 includes module substrates 2a, 2b and 2c, on which electronic elements 1a, 1b and 1c are respectively mounted, frames 3a, 3b, and 3c and covers 4a, 4b, and 4c that surround the electronic elements 1a, 1b and 1c respectively, and shield electromagnetic waves. Here, the electronic elements 1a, 1b and 1c include various communication elements used for NAD, Wi-Fi, BT communications and the like.

However, in the related art, all of the communication devices 1, 2, and 3 are horizontally spaced apart on one surface of the unit substrate 9, which may cause a problem of increasing an overall size (e.g., area) of electric communication modules.

Accordingly, there is a demand for a communication module capable of minimizing the product size while having various communication devices.

The above information is provided as background information only to assist with an understanding of the present disclosure. No determination has been made, and assertion is made, as to whether any of the above might be applicable as prior art with regard to the disclosure.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a module substrate includes a module substrate including a plurality of external connection electrodes disposed on a second surface thereof; communication elements mounted on the module substrate, the communication elements including one or more first communication elements mounted on a first surface of the module substrate and one or more second communication elements mounted on the second surface of the module substrate; a first heat radiation frame mounted on the first surface of the module substrate and configured to accommodate at least one of the one or more first communication elements; and a second heat radiation frame mounted on the second surface of the module substrate and configured to accommodate at least one of the one or more second communication elements. One or more of the external connection electrodes are disposed around the second heat radiation frame.

A mounting height of the first heat radiation frame with respect to the first surface of the module substrate may be greater than a mounting height of the one or more first communication elements, and a mounting height of the second heat radiation frame with respect to the second surface of the module substrate may be greater than a mounting height of the one or more second communication elements.

A cover may be coupled to the first heat radiation frame and may be configured to cover the first heat radiation frame.

A thermal interface material (TIM) may be interposed between the cover and the at least one of the one or more first communication elements, and may be configured to transfer heat generated in the at least one of the one or more first communication elements to the cover.

The first heat radiation frame may include a sidewall bonded to the module substrate and a seating portion orthogonal to the sidewall and on which the cover is seated.

The first heat radiation frame may include an outer sidewall configured to form an external shape of the first heat radiation frame and a blocking sidewall disposed in an internal space formed by the outer sidewall and configured to block electromagnetic interference between the at least one of the one or more first communication elements in the internal space.

The first heat radiation frame may include an extension portion having at least a part that is disposed inside the module substrate.

The extension portion may penetrate into the module substrate and may be connected to the second heat radiation frame.

An edge of the extension portion may be formed in a hook shape and the edge of the hook shape may penetrate into the module substrate and be disposed on the second surface of the module substrate.

The at least one of the one or more second communication elements may be disposed to face a sidewall of the first heat radiation frame.

A third heat radiation frame may be disposed on the second surface of the module substrate. The second heat radiation frame and the third heat radiation frame may be spaced apart from each other. At least one of the one or more external connection electrodes may be disposed between the second heat radiation frame and the third heat radiation frame.

In another general aspect, a communication module mounting structure includes a communication module including a module substrate, external connection electrodes disposed on a second surface of the model substrate, communication elements mounted on the module substrate, the communication elements including one or more first communication elements mounted on a first surface of the module substrate and one or more second communication elements mounted on the second surface of the module substrate, and a heat radiation frame configured to accommodate the one or more second communication elements;

and a unit substrate including a connection pad disposed on a first surface of the unit substrate and bonded to at least one of the external connection electrodes, and an accommodation portion configured to accommodate the heat radiation frame.

The heat radiation frame may include a first heat radiation frame and a second heat radiation frame spaced apart from the second surface of the module substrate. At least one of the external connection electrodes may be disposed between the first heat radiation frame and the second heat radiation frame. At least a part of the unit substrate may be disposed between the first heat radiation frame and the second heat radiation frame and electrically connected to one or more of the external connection electrodes.

A heat radiation pad may be coupled to a second surface of the unit substrate.

A thermal interface material (TIM) may be interposed between at least one of the one or more second communication elements and the heat radiation pad, the TIM having a first surface in contact with the at least one of the one or more second communication elements and a second surface in contact with the heat radiation pad.

A cover may be coupled to the heat radiation frame and may be configured to shield a space in which the one or more second communication elements are accommodated. A thermal interface material (TIM) may be interposed between the cover and at least one of the one or more second communication elements and may be configured to transfer heat generated in the at least one of the one or more second communication elements to the cover.

In another general aspect, a communication module includes a module substrate; communication elements mounted on the module substrate, the communication elements including one or more first communication elements mounted on a first surface of the module substrate and one or more second communication elements mounted on a second surface of the module substrate; and a heat radiation frame mounted on the module substrate and configured to accommodate at least one of the one or more second communication elements and mounted on second surface of the module substrate. The heat radiation frame may include a first heat radiation frame and a second heat radiation frame spaced apart from the second surface of the module substrate. The module substrate may include an external connection electrode disposed between the first heat radiation frame and the second heat radiation frame and configured to be bonded to a connection pad of a unit substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
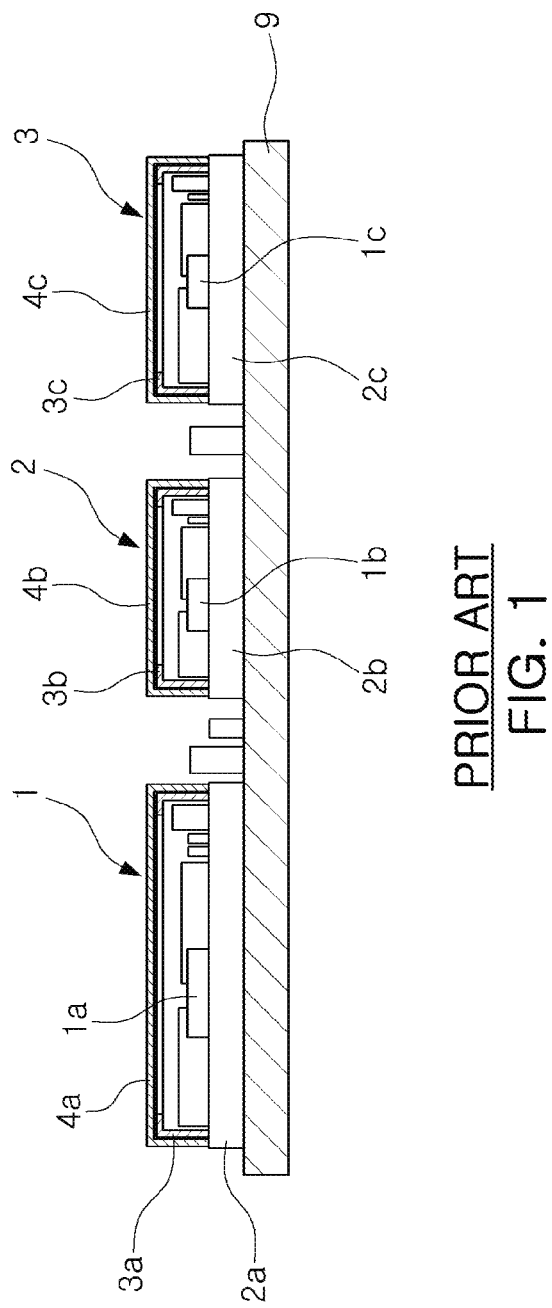
FIG. 1 is a cross-sectional view schematically showing an electric communication module of the related art.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

It is to be noted that the expressions such as the upper side, the lower side, the side face, etc. in the present specification are described based on illustrations in the drawings and may be expressed differently when a direction of the corresponding object changes.

Figure 2:
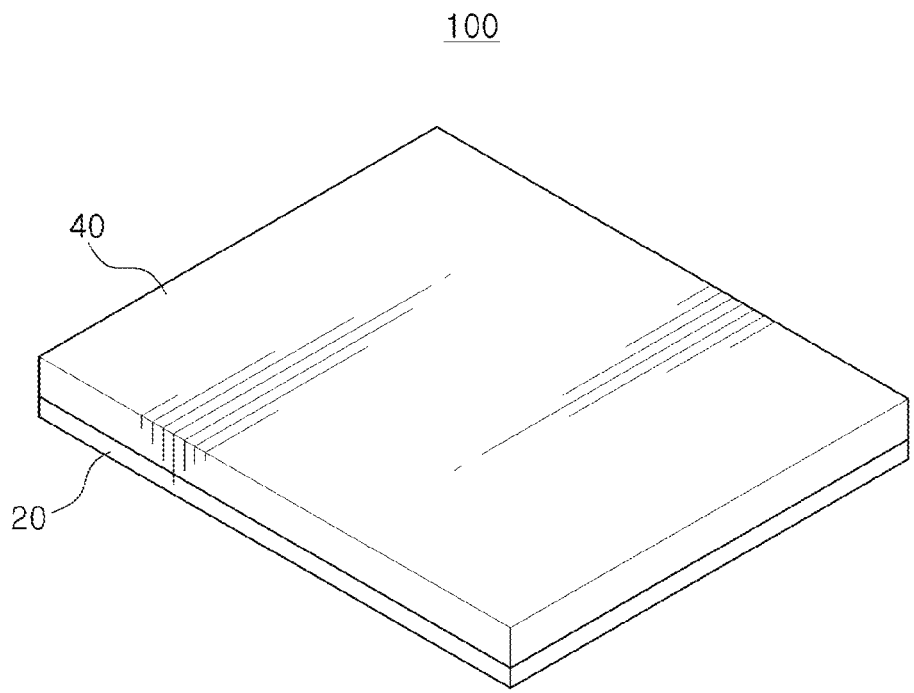
FIG. 2 is a perspective view schematically showing an example of a communication module.
Figure 3:
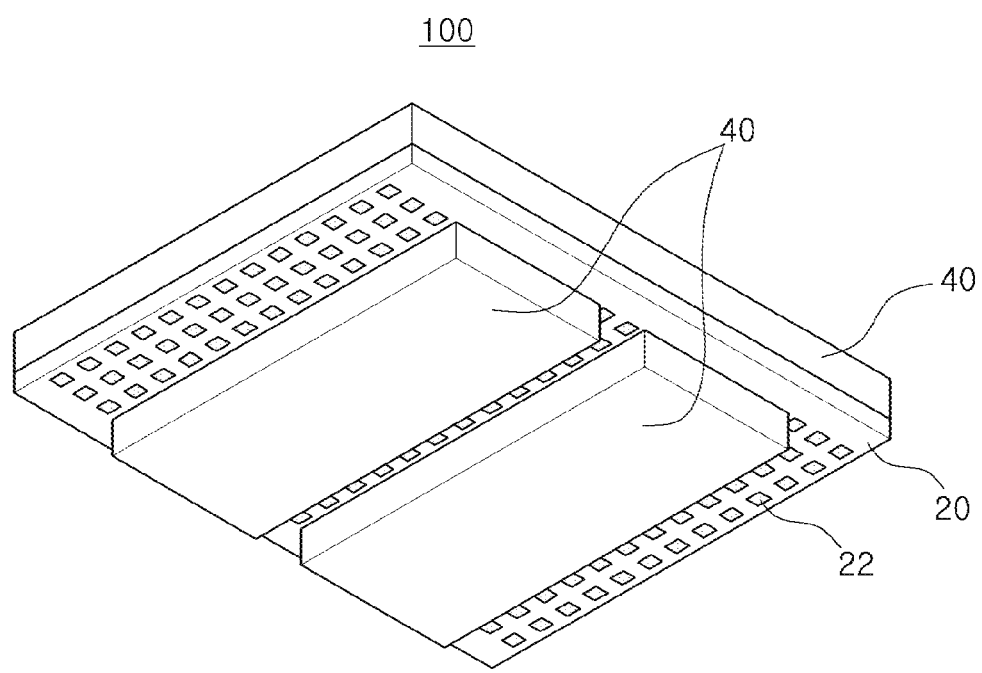
FIG. 3 is a bottom view of the communication module shown in FIG. 2.
Figure 4:
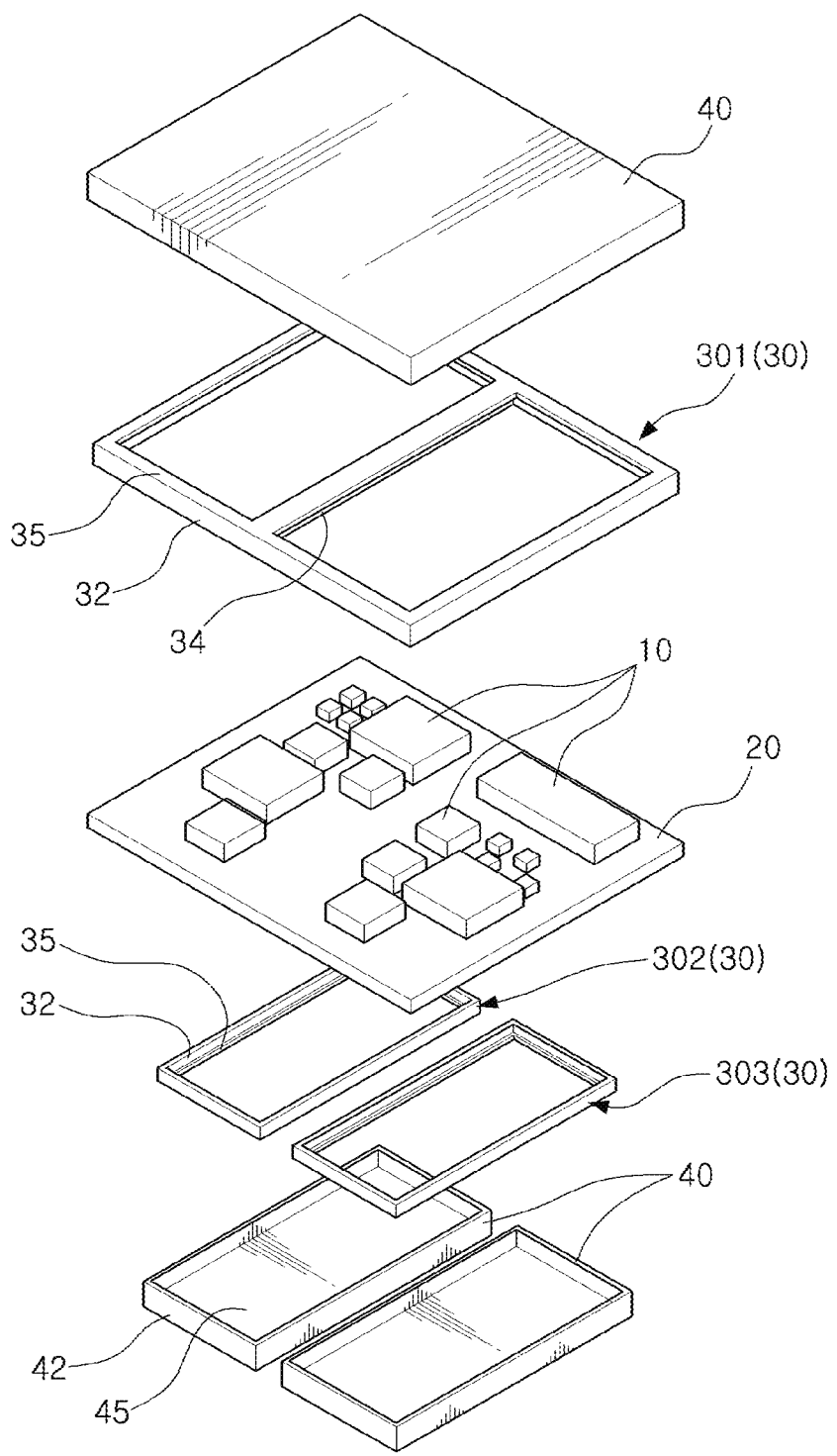
FIG. 4 is an exploded perspective view of the communication module shown in FIG. 2.
Figure 5:
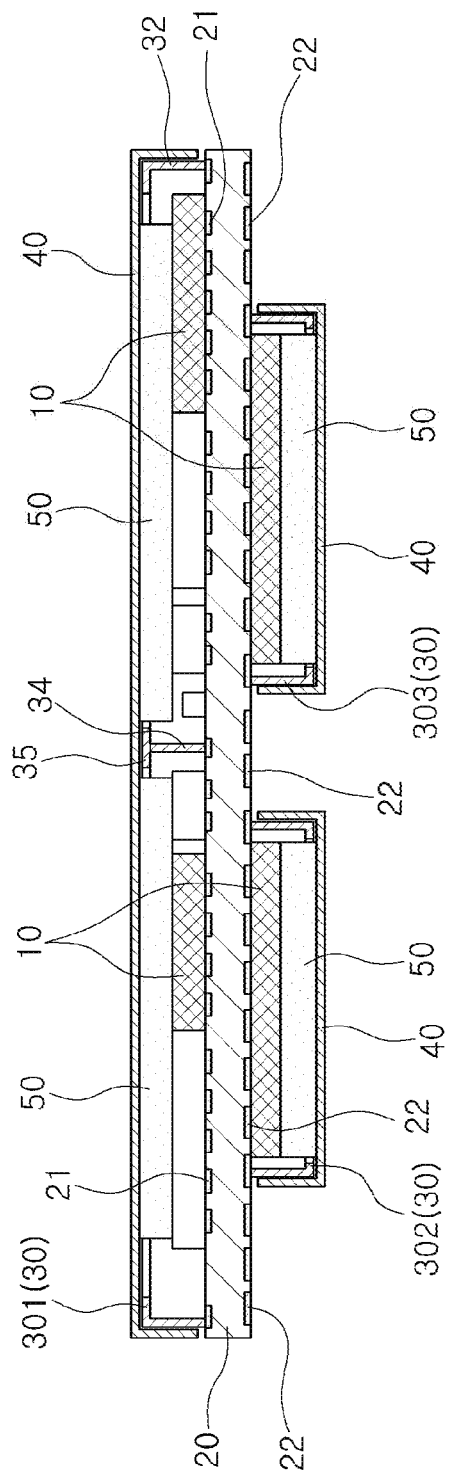
FIG. 5 is a cross-sectional view of the communication module shown in FIG. 2.

FIG. 2 is a perspective view schematically showing a communication module 100 according to an example. FIG. 3 is a bottom view of the communication module 100 shown in FIG. 2. FIG. 4 is an exploded perspective view of the communication module 100 shown in FIG. 2. FIG. 5 is a cross-sectional view of the communication module 100 shown in FIG. 2.

Referring to FIGS. 2 to 5, the communication module 100 may include a module substrate 20, a plurality of electronic elements 10, a heat radiation frame 30, and a cover 40.

The module substrate 20 is configured such that at least one electronic element 10 is mounted on each side of the module substrate 20. Various types of substrates (e.g., a printed circuit board (PCB), a flexible substrate, a ceramic substrate, a glass substrate, etc.) well known to the pertinent art may be used.

Mounting electrodes 21 for mounting the electronic elements 10 and a wiring pattern (not shown) electrically connecting the mounting electrodes 21 are arranged on a first surface of the module substrate and may also be arranged on a second surface of the module substrate 20.

The mounting electrodes 21 of the module substrate 20 may include at least one ground electrode. The ground electrode may be formed by exposing wiring or pads of a ground property formed on the module substrate 20. The ground electrode may be electrically connected to the heat radiation frame 30. In an example, the ground electrode may be arranged along sidewalls 32 and 34 of the heat radiation frame 30 bonded to the module substrate 20 and may be formed in a solid line shape or a broken line shape. However, the disclosure is not limited to such a configuration.

Further, external connection electrodes 22 to be connected to a unit substrate (90 in FIG. 6) are disposed on the second surface of the module substrate 20. The external connection electrodes 22 may also include at least one ground electrode.

A second heat radiation frame 302 and a third heat radiation frame 303 are disposed on the second surface of the module substrate 20. Thus, the external connection electrodes 22 are disposed around the second heat radiation frame 302 and the third heat radiation frame 303, and at least one of the external connection electrodes 22 is disposed between the second heat radiation frame 302 and the third heat radiation frame 303.

The module substrate 20 may be a multilayered substrate formed in a plurality of layers. A circuit pattern for forming an electrical connection may be formed between the layers of the module substrate 20.

The electronic element 10 includes various elements, such as an active element and a passive element, and any electronic components mountable on a substrate may be used as the electronic element 10.

Further, the active element among the electronic elements 10 includes a communication element used for communication. Here, the communication element may include a power amplifier, a front end module (FEM) element embedded with the power amplifier, a radio frequency (RF) filter, a base band filter, an RF integrated circuit (IC), and the like, but is not limited thereto.

Among the electronic elements 10, the electronic elements 10 in which interference occurs with each other may be distributed in a plurality of spaces formed by the heat radiation frames 30. Also, among the electronic elements 10, the electronic elements 10 that generate a lot of heat during operation may also be distributed in the plurality of spaces.

For example, as shown in FIG. 5, the electronic elements 10 are dispersed and mounted on both sides of the module substrate 20. Also, the electronic elements 10 may be disposed in a first heat radiation frame 301 of the heat radiation frame 30, and may be distributed in a plurality of spaces defined by the blocking sidewall 34 of the first heat radiation frame 301.

The heat radiation frame 30 accommodates the at least one electronic element 10 in an internal space and is distributed on both sides of the module substrate 20. Also, the heat radiation frame 30 is interposed between the cover 40 and the module substrate 20 to support the cover 40.

The heat radiation frame 30 may include the sidewalls 32 and 34 and a seating portion 35.

At least one of the side of the sidewalls 32 and 34 is bonded to the module substrate 20 to serve as a pillar between the cover 40 and the module substrate 20.

The sidewall 32 may be an outer sidewall and the sidewall 34 may be a blocking sidewall.

The outer sidewall 32 forms an external shape of the heat radiation frame 30. Therefore, the outer sidewall 32 is disposed along an edge of the heat radiation frame 30. In one example, the outer sidewall 32 is formed in an annular ring shape, but the disclosure is not limited to such an example. For example, various modifications are possible, such as the outer sidewall 32 being formed in a partially cut ring shape, or a broken line type ring shape.

The blocking sidewall 34 is disposed in an internal space defined by the outer sidewall 32 and disposed between the corresponding electronic elements 10 to prevent interference between the electronic elements 10 from occurring. Thus, the blocking sidewall 34 is disposed to block spaces between the electronic elements 10 where interference may occur. Accordingly, it is possible to effectively prevent electromagnetic interference from occurring between the adjacent electronic elements 10.

The single blocking sidewall 34 or a plurality of blocking sidewalls 34 may be provided. In one example, the blocking sidewall 34 is formed in a straight line shape. However, the present disclosure is not limited thereto. The blocking sidewall 34 may be modified in various shapes according to a shape of the electronic element 10 or shapes of the defined spaces. Also, the blocking sidewall 34 may be omitted.

The seating portion 35 is disposed on another surface of a sidewall and is orthogonal to the sidewall. The seating portion 35 may be formed by bending a portion of the sidewall, but is not limited thereto.

The cover 40 is seated on the seating portion 35. Therefore, the seating portion 35 is configured such that at least a part thereof is in surface contact with the cover 40.

Meanwhile, when the thickness of the sidewall is sufficiently thick, the seating portion 35 may be omitted.

The heat radiation frame 30 according to an example may be formed by processing a flat metal plate material by using a press device (not shown). Therefore, the flat metal plate material may be divided into the seating portion 35 and the sidewalls 32 and 34 through press processing, and the sidewalls 32 and 34 may be further formed by bending downward from the seating portion 35.

In an example, the heat radiation frame 30 includes the first heat radiation frame 301, the second heat radiation frame 302, and the third heat radiation frame 303.

The first heat radiation frame 301 is mounted on the first surface (e.g., the upper surface) of the module substrate 20. The second heat radiation frame 302 and the third heat radiation frame 303 are mounted on the second surface (e.g., the lower surface) of the module substrate 20. However, the disclosure is not limited to such a configuration. Various modifications are possible as necessary, such as two heat radiation frames 30 being disposed on the first surface of the module substrate 20.

The heat radiation frame 30 may be bonded to a ground electrode provided on the module substrate 20. The heat radiation frame 30 and the ground electrode may be bonded to each other via a conductive adhesive, such as solder or a conductive resin.

In an example, the first heat radiation frame 301 includes the blocking sidewall 34. The second heat radiation frame 302 and the third heat radiation frame 303 include only the outer sidewall 32 without the blocking sidewall 34. However, as described above, the blocking sidewall 34 may be disposed in the second heat radiation frame 302 and the third heat radiation frame 303.

The second heat radiation frame 302 and the third heat radiation frame 303 are spaced apart from each other by a predetermined or specified distance. At least one external connection electrode 22 is disposed between the second heat radiation frame 302 and the third heat radiation frame 303 in the module substrate 20. The external connection electrode 22 disposed between the second heat radiation frame 302 and the third heat radiation frame 303 may include at least one ground pad.

The heat radiation frame 30 of an example is formed such that a mounting height (measured from a surface of the module substrate) thereof is greater than a mounting height (measured from a surface of the module substrate) of the electronic elements 10. Therefore, when the heat radiation frame 30 and the electronic elements 10 are mounted on the module substrate 20, the electronic elements 10 are not exposed to an upper portion of the heat radiation frame 30.

The heat radiation frame 30 of an example is formed of a material having high thermal conductivity and capable of shielding electromagnetic waves. For example, stainless steel or an alloy of copper, zinc, and nickel may be used as the material of the heat radiation frame 30. However, the radiation frame 30 is not limited to such materials.

The cover 40 is coupled to the heat radiation frame 30 to protect the electronic elements 10 mounted on the module substrate 20 from the outside. Also, the cover 40 shields electromagnetic waves introduced from the outside.

The cover 40 may include a seating surface 45 that is seated in the seating portion 35 of the heat radiation frame 30 and a side surface 42 that is bent around the seating surface 45.

When the cover 40 is coupled to the heat radiation frame 30, the side surface 42 of the cover 40 is disposed on the outside of the heat radiation frame 30 and is disposed in close contact with the outer sidewall 32 of the heat radiation frame 30. Thus, the cover 40 may be firmly coupled to the heat radiation frame 30.

The cover 40 is formed of a material having high thermal conductivity and capable of shielding electromagnetic waves. For example, stainless steel, an alloy of copper, zinc, and nickel may be used as the material of the cover 40. The cover 40 may be formed of the same material as the heat radiation frame 30. However, the cover 40 is not limited to such materials.

Meanwhile, to increase the thermal conductivity, a thermal interface material (TIM) 50 may be disposed between the electronic element 10 and the cover 40. The TIM 50 is disposed such that one surface thereof is in contact with an inactive surface of the electronic element 10 and the other surface is in contact with the cover 40. The TIM 50 may selectively include a liquid type material, such as paste or grease, a sheet type material, a pad type material formed of silicon, or the like.

A plurality of TIMs 50 may be respectively attached to upper surfaces of the plurality of electronic elements 10. One TIM 50 may be simultaneously attached to the upper surfaces of the plurality of electronic elements 10.

The total mounting height of the electronic element 10 and the TIM 50 may be the same or similar to the mounting height of the heat radiation frame 30 in a state where the TIM 50 is stacked on the electronic element 10. Accordingly, when the cover 40 is coupled to the heat radiation frame 30, the other surface of the TIM 50 contacts the cover 40.

Figure 6:
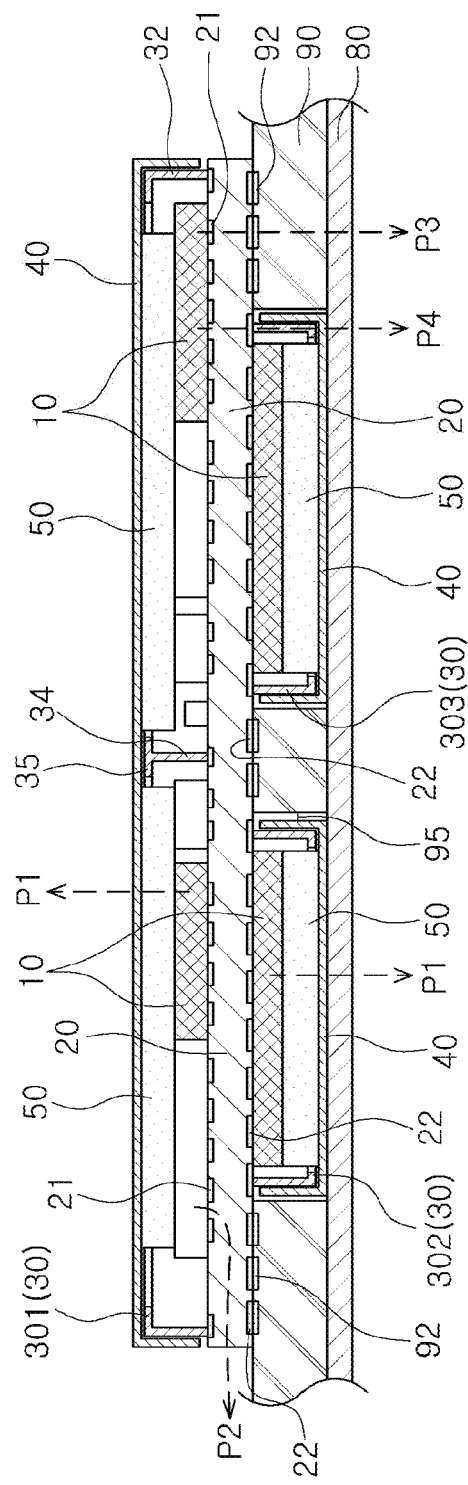
FIG. 6 is a cross-sectional view schematically showing a mounting structure of the communication module shown in FIG. 2.

The communication module 100 is mounted on the unit substrate 90 and electrically connected to the unit substrate 90 as shown in FIG. 6.

FIG. 6 is a cross-sectional view schematically showing a mounting structure of a communication module shown in FIG. 2. Referring to FIG. 6, the unit substrate 90 is configured in the form of an insulating substrate having circuit wiring and includes at least one accommodation portion 95 therein.

For example, the unit substrate 90 may use various kinds of substrates (e.g., a printed circuit board (PCB), a flexible substrate, a ceramic substrate, a glass substrate, etc.).

The accommodation portion 95 is configured in the form of a hole penetrating the unit substrate 90. Components mounted on a second surface (in one example, a lower surface) of the module substrate 20 in the communication module 100 are inserted into and disposed in one or more of the accommodation portions 95.

In an example, the unit substrate 90 includes two accommodation portions 95 spaced apart from each other. The second heat radiation frame 302 and the third heat radiation frames 303 are respectively inserted into the two accommodation portions 95.

A plurality of connection pads 92 are provided on a first surface (e.g., an upper surface) of the unit substrate 90 and are electrically connected to the external connection electrodes 22 of the module substrate 20, which is mounted on the first surface of the unit substrate 90. The connection pad 92 and the external connection electrode 22 may be electrically and physically bonded via a conductive adhesive such as solder.

A heat radiation pad 80 is attached to the second surface of the unit substrate 90. An electrode pad is not disposed on the second surface of the unit substrate 90. The cover 40 of the second heat radiation frame 302 and the third heat radiation frame 303 disposed in the accommodation portion 95 has an outer surface disposed in contact with the heat radiation pad 80.

The heat radiation pad 80 may be formed of silicon or the like, but is not limited thereto. The heat radiation pad 80 may be formed of various materials and various shapes as long as the heat radiation pad 80 may effectively radiate heat. Also, the heat radiation pad 80 may be omitted. If the heat radiation pad 80 is omitted, an electrode pad may be disposed on the second surface of the unit substrate 90.

In an example, a TCU (Telematics control Unit) board mounted on a vehicle is used as the unit substrate 90. However, the configuration of the present disclosure is not limited thereto. Although not shown, the unit substrate 90 may have a connector on the first surface or the second surface. The connector is electrically connected to the plurality of connection pads 92 and is used to electrically connect the outside and the unit substrate 90.

In the communication module 100 according to an example, a plurality of communication devices are mounted together on one module substrate 20. The plurality of communication devices is distributed on both sides of the module substrate 20 and is disposed apart from each other in the different heat radiation frames 30.

For example, cellular related electronic elements 10, such as 2G, 3G, 4G, 5G, etc. may be distributed and arranged in the first heat radiation frame 301, Wi-Fi related electronic elements 10 may be disposed in the second heat radiation frame 302, and Bluetooth® (BT) communication related electronic elements 10 may be disposed in the third heat radiation frame 303. However, the present disclosure is not limited thereto. Various combinations are possible.

As described above, since the communication module 100 according to an example includes the plurality of communication devices arranged not only horizontally but vertically, the size of the entire communication module 100 may be minimized. Further, interference between the communication devices may also be blocked through the one or more heat radiation frames 30.

In addition, the heat radiation frame 30 according to an example is used as a heat transfer path for radiating heat generated in the electronic elements 10 to the outside.

Referring to FIG. 6, the mounting structure of the communication module 100 according to an example has four heat radiation paths.

A first heat radiation path P1 is a path through which the heat generated in the electronic element 10 is transferred to the cover 40 through the TIM 50 and radiated directly to the outside or through the heat radiation pad 80. A second heat radiation path P2 is a path through which the heat generated in the electronic element 10 is transferred to the module substrate 20 and then radiated to the outside through the module substrate 20.

A third heat radiation path P3 is a path through which the heat generated in the electronic element 10 is transferred to the module substrate 20 and then radiated to the outside through the unit substrate 90 on which the module substrate 20 is mounted. A fourth heat radiation path P4 is a path through which the heat generated by the electronic element 10 is transferred to the module substrate 20 and then radiated to the outside through the heat radiation frame 30 and the cover 40 mounted on the module substrate 20.

Accordingly, even if the heat generated from the electronic elements 10 mounted on both sides of the module substrate 20 is concentrated on the module substrate 20, the heat may be quickly radiated to the outside through the second to fourth heat radiation paths P2 to P4.

Since the mounting structure of the communication module 100 according to an example includes various heat radiation paths, the heat radiation efficiency may be maximized.

Also, the communication module 100 of an example has the at least two heat radiation frames 302 and 303 spaced apart from each other on the second surface of the module substrate 20. When mounted on the unit board 90, the two heat radiation frames 302 and 303 are inserted into and disposed in different accommodation portions 95.

To secure a spaced distance between the two heat radiation frames 302 and 303 disposed on the second surface of the module substrate 20, at least one electrode pad 22 may be disposed between the two heat radiation frames 302 and 303 on the second surface of the module substrate 20.

Meanwhile, in an example, the two heat radiation frames 302 and 303 are disposed on the second surface of the module substrate 20. However, it may be also considered that only one heat radiation frame 30 is disposed on the second surface of the module substrate 20 and the blocking sidewall 34 is disposed inside in the same manner as on the first surface of the module substrate 20.

As a result of measuring the heat radiation effect with respect to these structures, as compared with the structure in which the one heat radiation frame 30 is inserted into the unit substrate 90, the heat radiation effect increases in the structure in which the two heat radiation frames 302 and 303 spaced apart from each other are respectively inserted into the different accommodation portions 95.

Figure 12:
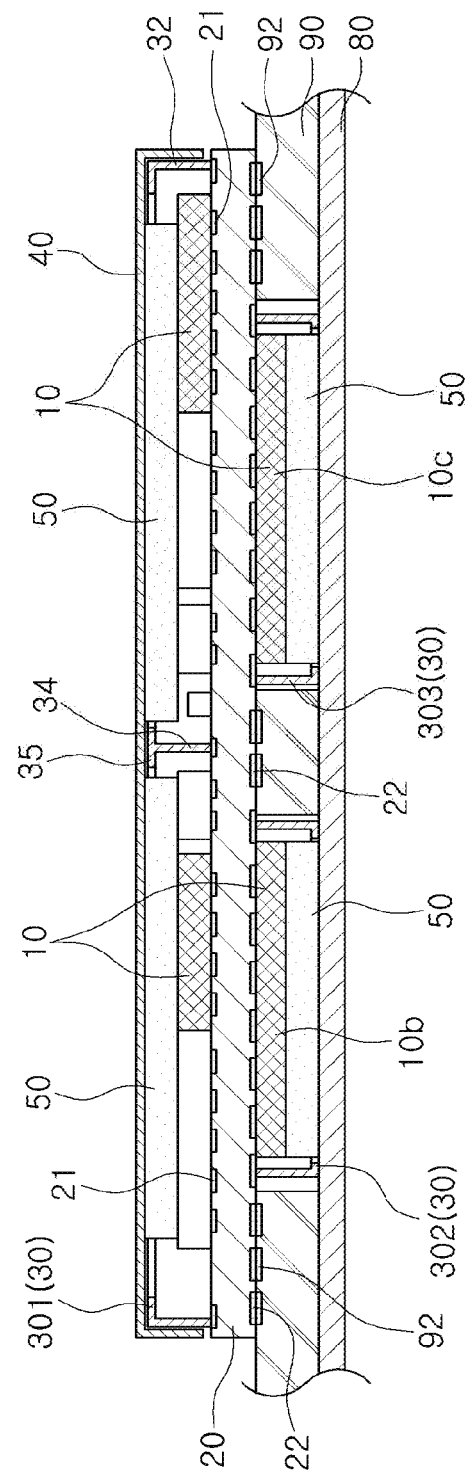
FIG. 12 is a cross-sectional view schematically showing an example of a mounting structure of a communication module.
Figure 13:
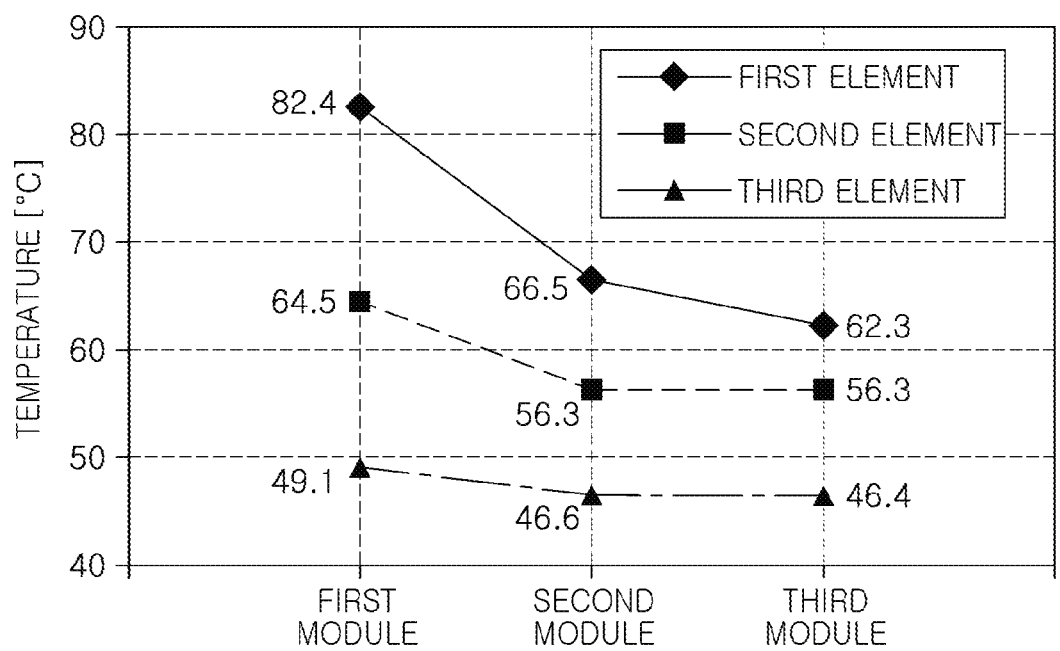
FIG. 13 is a graph showing a comparison of temperature between a communication module of the related art and an example of a communication module.

FIG. 13 is a graph showing a comparison of temperature between a communication module of the related art and a communication module according to one or more examples disclosed herein. FIG. 13 is a diagram showing the comparison of temperature between the communication module of the related art (hereinafter referred to as a first module), a communication module shown in FIG. 12 (hereinafter referred to as a second module) and a communication module shown in FIG. 5 (hereinafter referred to as a third module), wherein temperatures of three heat generating elements (first, second, and third elements) among the electronic elements 10 provided in the communication module are measured and displayed.

Here, the first element is an electronic element 10 disposed in the second heat radiation frame 302, the second element is the electronic element 10 disposed in the first heat radiation frame 301, and the third element is the electronic element 10 disposed in the third heat radiation frame 303 (the second heat radiation frame in FIG. 12), all of which are communication elements and heat generating elements.

Referring to FIG. 13, it may be seen that as compared with the first module, which is the communication module of the related art, the temperature of each of the elements is significantly lowered in the communication modules (the second and third modules) of the present disclosure in which the heat generating elements are distributed on both sides of the module substrate 20.

Also, it may be seen that as compared with the structure of FIG. 12, in which two heat generating elements are disposed in one heat radiation frame 302, the temperature is further lowered in the structure of FIG. 5, in which two heat generating elements are distributed in the two heat radiation frames 302 and 303 and the unit substrate 90 is disposed between the two heat radiation frames 302 and 303.

Meanwhile, although not shown, the heat radiation frame 30 of the communication module according to an example may further include a heat radiation pillar.

The heat radiation pillar may be formed in the shape of a metal pillar, such that one end thereof is connected to the seating portion 35, and another end thereof is bonded to a ground electrode of the module substrate 20.

The heat radiation pillar is disposed at a position adjacent to the electronic element 10 that generates a lot of heat to provide an additional heat radiation path. Therefore, the heat radiation pillar is not limited to the shape of the pillar and may be modified into various shapes, such as a block or a wall as long as it may effectively radiate heat.

The present disclosure is not limited to the above-described examples and various modifications are possible.

Figure 7:
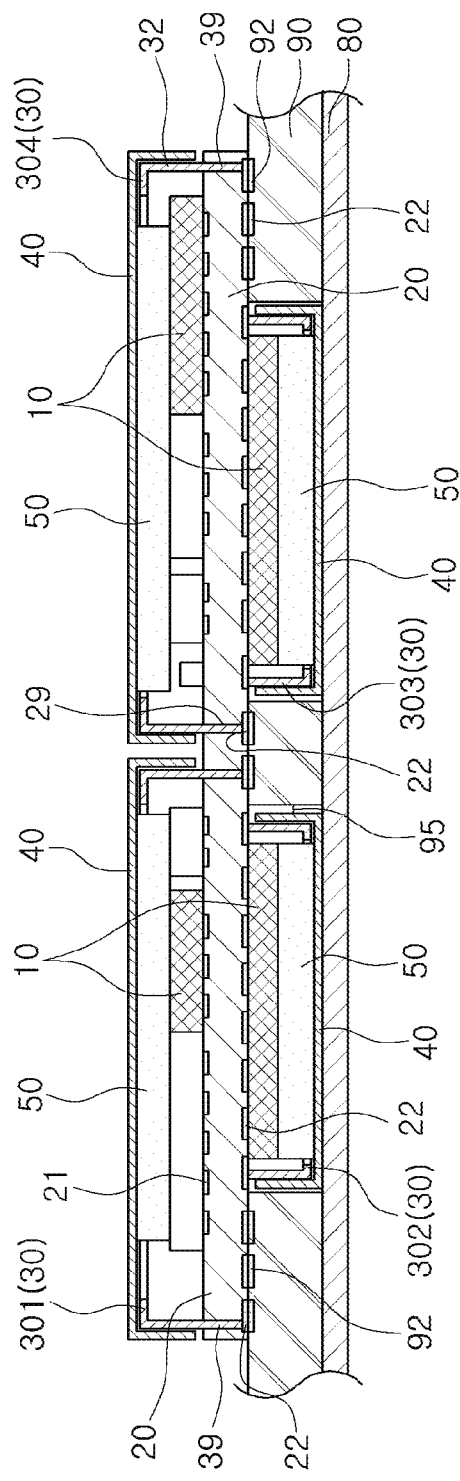
FIG. 7 is a cross-sectional view schematically showing an example of a mounting structure of a communication module.

FIG. 7 is a cross-sectional view schematically showing a mounting structure of a communication module according to another example.

Referring to FIG. 7, in the communication module according to the example, the heat radiation frame 30 is disposed on a first surface of the module substrate 20 and includes the first heat radiation frame 301 and a fourth heat radiation frame 304. The first heat radiation frame 301 and the fourth heat radiation frame 304 may be spaced apart from each other, but may be alternatively arranged to be in contact with each other. Also, although covers 40 are respectively coupled to each of the first heat radiation frame 301 and the fourth heat radiation frame 304 in this example, a single cover may be configured to cover both the first heat radiation frame 301 and the fourth heat radiation frame 304 together.

Also, the communication module according to the example is provided with an insertion portion 29 in the module substrate 20. The insertion portion 29 may be formed in the shape of a through hole, but is not limited thereto. The insertion portion 29 may be formed in the shape of a groove.

Also, the heat radiation frame 30 of the example includes an extension portion 39, of which at least a part is inserted into the insertion portion 29. The extension portion 39 may be formed in a protruding shape and may be divided into a part to be inserted into the insertion portion 29.

For example, the extension portion 39 may be formed in a pin shape or a block shape. However, the present disclosure is not limited thereto. The extension portion 39 may be modified into various sizes and shapes as long as it may be inserted into the insertion portion 29.

When the extension portion 39 is inserted and disposed in the module substrate 20, heat concentrated on the module substrate 20 may be transferred to the heat radiation frame 30 more effectively. Therefore, the heat radiation effect may be further enhanced.

In FIG. 7, the extension portion 39 is provided only in the first heat radiation frame 301 and the fourth heat radiation frame 304 for convention of description, but the disclosure is not limited to such a configuration. The second heat radiation frame 302 and the third heat radiation frame 303 may also be provided with extension portions.

The extension portion 39 may also be directly connected to the electrode pad 22 formed on the module substrate 20. For example, the first heat radiation frame 301 mounted on the first surface of the module substrate 20 may be connected to the electrode pad 22 formed on a second surface of the module substrate 20. In this case, heat of the first heat radiation frame 301 may be directly transferred to the unit board 90 via the electrode pad 22.

Figure 8:
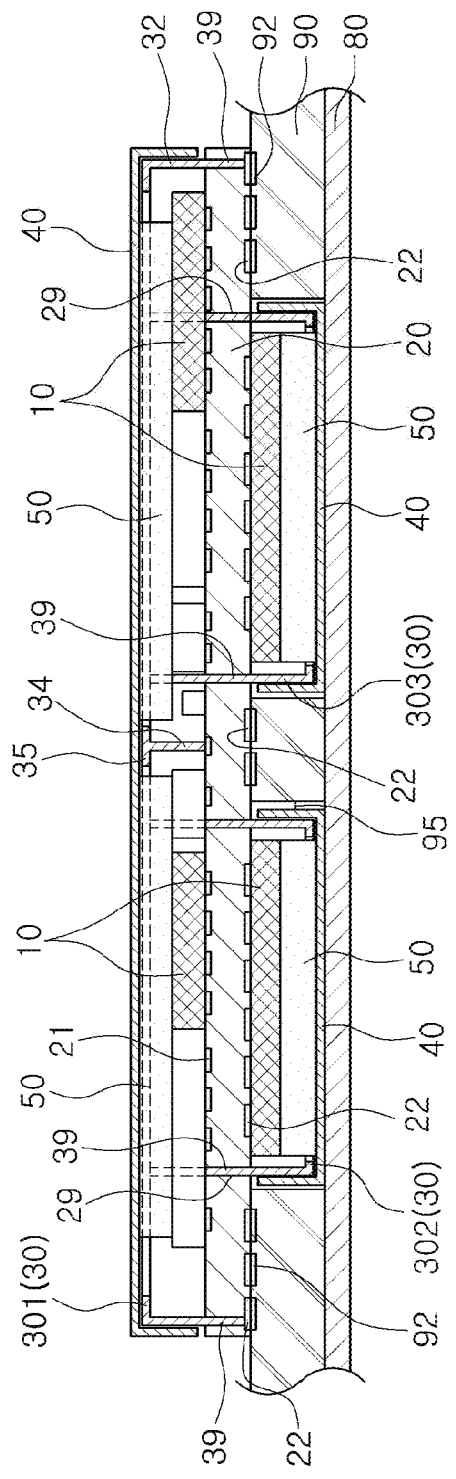
FIG. 8 is a cross-sectional view schematically showing an example of a mounting structure of a communication module.

FIG. 8 is a cross-sectional view schematically showing a mounting structure of a communication module according to another example.

Referring to FIG. 8, in the communication module of the example, the first heat radiation frame 301 disposed on a first surface of the module substrate 20 and the second and third heat radiation frames 302 and 303 disposed on a second surface of the module substrate 20 are physically connected to each other.

More specifically, in the communication module according to the example in FIG. 8, the insertion portion 29 is formed in the shape of a through hole completely penetrating into the module substrate 20, and at least one of the extension portions 39 of the second heat radiation frame 302 and the third heat radiation frame 303 penetrates into the insertion portion 29 and is connected to the first heat radiation frame 301.

To this end, sidewalls of the second heat radiation frame 302 and the third heat radiation frame 303 are arranged such that at least a part thereof faces the first heat radiation frame 301.

In describing the present disclosure, the meaning that two components are arranged to be opposite to each other or face each other may be that when a first component is projected perpendicular to the plane in which a second component is disposed, a projected image of the first component is disposed to overlap the second component.

Thus, a part of the sidewalls of the second heat radiation frame 302 and the third heat radiation frame 303, where the extension portion 39 is formed, is disposed to face the sidewalls 32 and 34 or the seating portion 35 of the first heat radiation frame 301.

Although it is shown that the extension portion 39 of the second heat radiation frame 302 and the extension portion 39 of the third heat radiation frame 303 are both connected to the seating portion 35 of the first heat radiation frame 301, the present disclosure is not limited thereto. The first heat radiation frame 301 may be configured to be partially or wholly connected to the sidewalls 32 and 34.

Similarly, although not shown, an extension portion may be formed in the first heat radiation frame 301 and connected to the second heat radiation frame 302 or the third heat radiation frame 303.

To this end, the sidewalls of the first heat radiation frame 301 are arranged such that at least a part thereof is disposed to face the second heat radiation frame 302 or the third heat radiation frame 303.

As configured above, during a reflow process for mounting the communication module on the unit substrate 90, the second heat radiation frame 302 or the third heat radiation frame 303 mounted on the second surface of the module substrate 20 may be suppressed from being separated from the module substrate 20.

Meanwhile, the disclosure is not limited to the configuration of the example. Various modifications are possible, such as the extension portion 39 of the second heat radiation frame 302 or the third heat radiation frame 303 being configured to be bonded to the extension portion 39 of the first heat radiation frame 301 inside the insertion portion 29.

Also, when the extension portions 39 are not arranged to face the heat radiation frame 30 disposed on the opposite surface, various modifications are possible, such as the extension portion 39 being formed long and then bent and inserted into the insertion portion 29.

Figure 9:
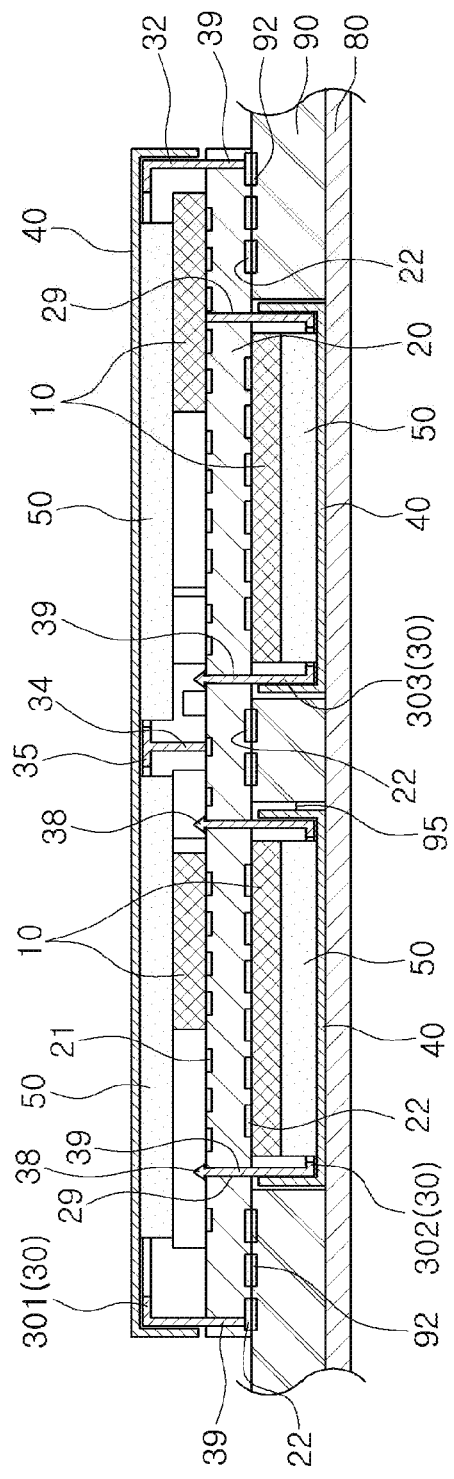
FIG. 9 is a cross-sectional view schematically showing an example of a mounting structure of a communication module.

FIG. 9 is a cross-sectional view schematically showing a mounting structure of a communication module according to another example.

Referring to FIG. 9, in the communication module according to the example, the insertion portion 29 of the module substrate 20 is formed in the shape of a through-hole, and at least one of the extension portions 39 of the first heat radiation frame 301 penetrates into the insertion portion 29, such that an edge thereof is exposed to the outside of the module substrate 20 and a hooking portion 38 is provided in the edge of the extension portion 39 exposed to the outside of the module substrate 20.

The hooking portion 38 is formed in the shape of a hook or an arrowhead. When the extension portion 39 is inserted into the insertion portion 29, the extension portion 39 is folded to overlap the extension portion 39 as much as possible. When the extension portion 39 protrudes outside the insertion portion 29, the extension portion 39 extends in a surface direction of the module substrate 20. Thus, the hooking portion 38 penetrates into the module substrate 20 and is disposed on the opposite side of the module substrate 20.

Owing to such a coupling structure, the heat radiation frame 30 coupled to the module substrate 20 by the hooking portion 38 may not be easily separated from the module substrate 20. During a reflow process, the second heat radiation frame 302 or the third heat radiation frame 303 mounted on the second surface of the module substrate 20 may be suppressed from being separated from the module substrate 20.

Figure 10:
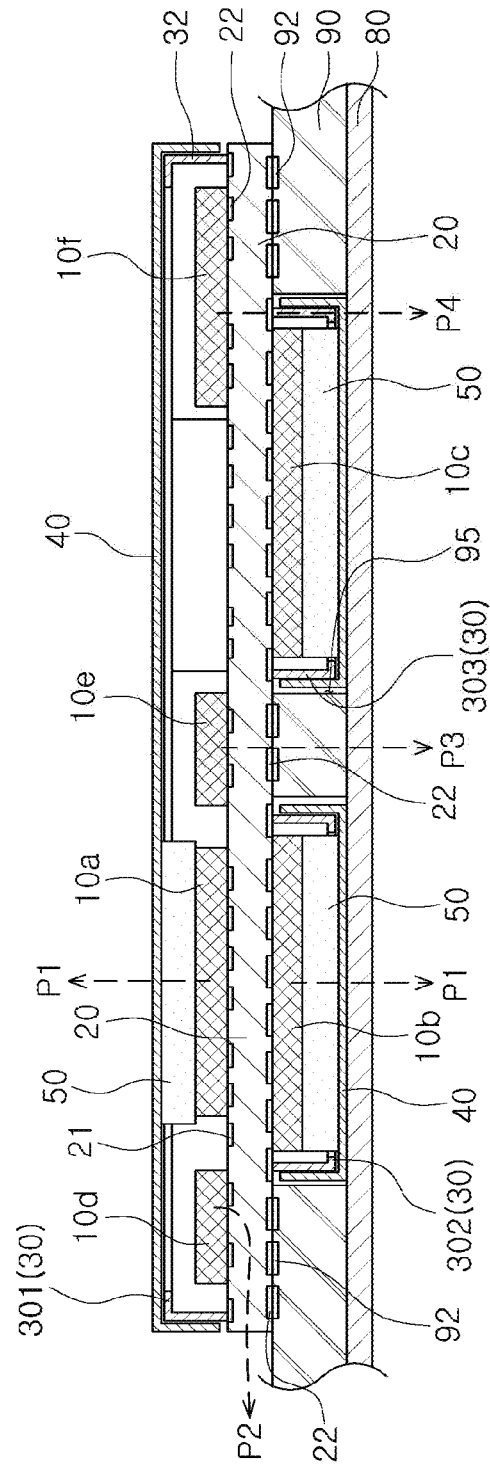
FIG. 10 is a cross-sectional view schematically showing an example of a mounting structure of a communication module.

FIG. 10 is a cross-sectional view schematically showing a mounting structure of a communication module according to another example.

Referring to FIG. 10, in the communication module according to the example, the first heat radiation frame 301 does not have a blocking sidewall. Therefore, an internal space of the first heat radiation frame 301 is configured as one space.

Also, in the communication module according to the example, heat generating elements 10$a$ through 10$f$, which generate a large amount of heat among the electronic elements 10, are arranged on different heat radiation paths P1 to P4.

For example, the first to third heat generating elements 10$a$ through 10$c$ may be disposed between the TIM 50 and the module substrate 20, such that heat is radiated as much as possible through the first heat radiation path P1, and the fourth heat generating element 10$d$ may be disposed adjacent to a side surface of the module substrate 20, such that heat is radiated as much as possible through the second heat radiation path P2.

Also, the fifth heat generating element 10$e$ may be disposed at a position as close as possible to the unit substrate 90, such that heat is radiated as much as possible through the third heat radiation path P3, and the sixth heat generating element 10$f$ may be disposed at a position facing the heat radiation frame 30 disposed on the opposite surface of the module substrate 20, such that heat is radiated as much as possible through the fourth heat radiation path P4.

In this case, since the heat generating elements 10$a$ through 10$f$ radiate heat through the different heat radiation paths P1 through P4, heat may be prevented from being concentrated at a specific position of the communication module, thereby further increasing the heat radiation effect.

Figure 11:
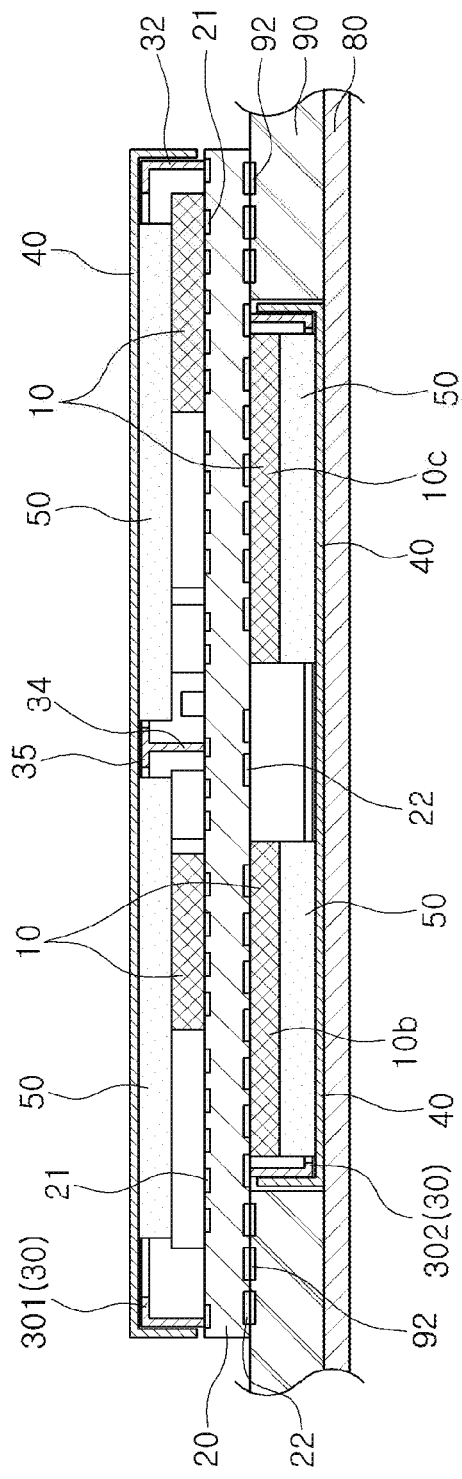
FIG. 11 is a cross-sectional view schematically showing an example of a mounting structure of a communication module.

FIG. 11 is a cross-sectional view schematically showing a mounting structure of a communication module according to another example.

Referring to FIG. 11, the communication module according to the example includes only the second heat radiation frame 302 on a second surface of the module substrate 20. A plurality of electronic elements mounted on the second surface of the module substrate 20 are all disposed in the second heat radiation frame 302.

When the communication module is configured as described in the example, the unit substrate 90 has only one receiving portion 95.

Meanwhile, in the example, the second heat radiation frame 302 does not have a blocking sidewall, but the disclosure is not limited to this configuration. The blocking sidewall may be added to the second heat radiation frame 302.

FIG. 12 is a cross-sectional view schematically showing a mounting structure of a communication module according to another example.

Referring to FIG. 12, in the communication module according to the example, a cover is omitted in the second heat radiation frame 302 and the third heat radiation frame 303.

Accordingly, one surface of the TIM 50 disposed in the second heat radiation frame 302 and the third heat radiation frame 303 is in contact with an inactive surface of the electronic element 10 and the other surface thereof is in direct contact with the heat radiation pad 80 disposed on a second surface of the unit substrate 90. In this case, heat generated by the electronic element 10 may be more effectively discharged to the heat radiation pad 80 side, and thus the heat radiation effect may be increased.

When the communication module is configured as described in the example, electronic elements 10 processing digital signals may be arranged in the second heat radiation frame 302 and the third heat radiation frame 303, and electronic elements 10 processing analog signals may be arranged in the first heat radiation frame 301.

Accordingly, even if a cover is not coupled to the second heat radiation frame 302 and the third heat radiation frame 303, interference between the electronic elements 10 arranged in the second heat radiation frame 302 and the third heat radiation frame 303 may be minimized as much as possible.

According to the various examples in the present disclosure, since a plurality of communication devices are arranged not only horizontally but vertically, the size of the entire communication module may be minimized. Further, interference between the communication devices may also be blocked through heat radiation frames, and various heat radiation paths may be provided, and thus the heat radiation effect may be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A communication module comprising:
    a module substrate including a plurality of external connection electrodes disposed on a second surface thereof;
    communication elements mounted on the module substrate, the communication elements including one or more first communication elements mounted on a first surface of the module substrate and one or more second communication elements mounted on the second surface of the module substrate;
    a first heat radiation frame mounted on the first surface of the module substrate and configured to accommodate at least one of the one or more first communication elements; and
    a second heat radiation frame mounted on the second surface of the module substrate and configured to accommodate at least one of the one or more second communication elements, and
    a third heat radiation frame disposed on the second surface of the module substrate,
    wherein the second heat radiation frame and the third heat radiation frame are spaced apart from each other, and
    wherein at least one of the plurality of external connection electrodes is disposed between the second heat radiation frame and the third heat radiation frame.

2. The communication module of claim 1, wherein a mounting height of the first heat radiation frame with respect to the first surface of the module substrate is greater than a mounting height of the one or more communication elements mounted on the first surface, and
    a mounting height of the second heat radiation frame with respect to the second surface of the module substrate is greater than a mounting height of the one or more communication elements mounted on the second surface.

3. The communication module of claim 1, further comprising a cover coupled to the first heat radiation frame and configured to cover the first heat radiation frame.

4. The communication module of claim 3, further comprising a thermal interface material (TIM) interposed between the cover and the at least one of the one or more first communication elements, and configured to transfer heat generated in the at least one of the one or more first communication elements to the cover.

5. The communication module of claim 3, wherein the first heat radiation frame includes:
    a sidewall bonded to the module substrate; and
    a seating portion orthogonal to the sidewall and on which the cover is seated.

6. The communication module of claim 3, wherein the first heat radiation frame includes:
    an outer sidewall configured to form an external shape of the first heat radiation frame; and
    a blocking sidewall disposed in an internal space formed by the outer sidewall and configured to block electromagnetic interference between the at least one of the one or more first communication elements in the internal space.

7. The communication module of claim 1, wherein the first heat radiation frame further includes an extension portion having at least a part that is disposed inside the module substrate.

8. The communication module of claim 7, wherein the extension portion penetrates into the module substrate and is connected to the second heat radiation frame.

9. The communication module of claim 1, wherein either one or both of the second heat radiation frame and the third heat radiation frame includes an extension portion having at least a part that is disposed inside the module substrate, and
    wherein an edge of the extension portion is formed in a hook shape and the edge of the hook shape penetrates into the module substrate and is disposed on the first surface of the module substrate.

10. The communication module of claim 7, wherein the at least one of the one or more second communication elements is disposed to face a sidewall of the first heat radiation frame.

11. A communication module mounting structure comprising:
    a communication module comprising
        a module substrate,
        external connection electrodes disposed on a second surface of the module substrate,
        communication elements mounted on the module substrate, the communication elements including one or more first communication elements mounted on a first surface of the module substrate and one or more second communication elements mounted on the second surface of the module substrate,
        a first heat radiation frame mounted on the first surface of the module substrate and configured to accommodate at least one of the one or more first communication elements, a second heat radiation frame mounted on the second surface of the module substrate and configured to accommodate at least one of the one or more second communication elements, and a third heat radiation frame disposed on the second surface of the module substrate; and a unit substrate comprising a connection pad disposed on a first surface of the unit substrate and bonded to at least one of the external connection electrodes, and an accommodation portion configured to accommodate the second heat radiation frame and the third heat radiation frame, wherein the second heat radiation frame and the third heat radiation frame are spaced apart from each other, and wherein at least one of the external connection electrodes is disposed between the second heat radiation frame and the third heat radiation frame.

12. The communication module mounting structure of claim 11, wherein at least a part of the unit substrate is disposed between the second heat radiation frame and the third heat radiation frame and electrically connected to one or more of the external connection electrodes.

13. The communication module mounting structure of claim 11, further comprising a heat radiation pad coupled to a second surface of the unit substrate.

14. The communication module mounting structure of claim 11, further comprising:

a cover coupled to the second heat radiation frame and configured to shield a space in which the one or more second communication elements are accommodated; and a thermal interface material (TIM) interposed between the cover and at least one of the one or more second communication elements, and configured to transfer heat generated in the at least one of the one or more second communication elements to the cover.

15. A communication module mounting structure comprising:

a communication module comprising
a module substrate,
external connection electrodes disposed on a second surface of the module substrate,
communication elements mounted on the module substrate, the communication elements including one or more first communication elements mounted on a first surface of the module substrate and one or more second communication elements mounted on the second surface of the module substrate, and
a heat radiation frame configured to accommodate the one or more second communication elements;

a unit substrate comprising a connection pad disposed on a first surface of the unit substrate and bonded to at least one of the external connection electrodes, and an accommodation portion configured to accommodate the heat radiation frame, a heat radiation pad coupled to a second surface of the unit substrate; and a thermal interface material (TIM) interposed between at least one of the one or more second communication elements and the heat radiation pad, the TIM having a first surface in contact with the at least one of the one or more second communication elements and a second surface in contact with the heat radiation pad.

* * * * *